US012562724B2

(12) United States Patent
Langner et al.

(10) Patent No.: US 12,562,724 B2
(45) Date of Patent: Feb. 24, 2026

(54) LOCAL INTERCONNECTED NETWORK BUS REPEATER DELAY COMPENSATION

(71) Applicant: AyDeeKay LLC, Aliso Viejo, CA (US)

(72) Inventors: Artur Langner, Aliso Viejo, CA (US); Colin Ramsay, Aliso Viejo, CA (US)

(73) Assignee: AyDeeKay, Aliso Viejo, CA (US)

( * ) Notice: Subject to any disclaimer, the term of this patent is extended or adjusted under 35 U.S.C. 154(b) by 86 days.

(21) Appl. No.: 18/378,614

(22) Filed: Oct. 10, 2023

(65) Prior Publication Data

US 2024/0120908 A1     Apr. 11, 2024

Related U.S. Application Data

(60) Provisional application No. 63/415,282, filed on Oct. 11, 2022.

(51) Int. Cl.
| | |
|---|---|
| *H03K 5/14* | (2014.01) |
| *H03K 5/19* | (2006.01) |
| *H04L 12/28* | (2006.01) |
| *H04L 12/40* | (2006.01) |
| *H03K 5/00* | (2006.01) |

(52) U.S. Cl.
CPC ................ *H03K 5/14* (2013.01); *H03K 5/19* (2013.01); *H04L 12/28* (2013.01); *H04L 12/40* (2013.01); *H03K 2005/00084* (2013.01)

(58) Field of Classification Search
CPC ....................... H03K 5/14; H03K 5/19; H03K 2005/00084; H04L 12/28; H04L 12/40
See application file for complete search history.

(56) References Cited

U.S. PATENT DOCUMENTS

| | | | |
|---|---|---|---|
| 2004/0126065 A1* | 7/2004 | Levy ........................ | G02B 6/43 385/88 |
| 2006/0123176 A1* | 6/2006 | Fredriksson ........ | H04L 27/2335 710/305 |

(Continued)

FOREIGN PATENT DOCUMENTS

| | | | | |
|---|---|---|---|---|
| CN | 101051851 A | * | 10/2007 | |
| CN | 101449189 A | * | 6/2009 | ........... G02B 6/4292 |
| DE | 202012013430 U1 | * | 1/2017 | ........... A61N 5/1048 |

OTHER PUBLICATIONS

Translation of DE-202012013430-U1 (Year: 2017).*

(Continued)

*Primary Examiner* — Henry Tsai
*Assistant Examiner* — John B Roche
(74) *Attorney, Agent, or Firm* — Steven Stupp

(57) ABSTRACT

An integrated circuit is described. This integrated circuit may include: a receive circuit, coupled to a segment of a LIN bus, that receives bits; a measurement circuit, coupled to the receive circuit, that measures: a rising-edge time and a falling-edge time in the bits, or a bit time and a second bit time in the bits; control logic, coupled to the measurement circuit, that compares the rising-edge time and the falling-edge time, or the bit time and the second bit time; a transmit circuit, coupled to the receive circuit, that transmits the bits on a second segment of the LIN bus; and a delay circuit, coupled to the control logic, that applies, based at least in part on the comparison, a delay to: one or more rising edges or falling edges in the bits; or one or more bit times or second bit times in the bits.

20 Claims, 8 Drawing Sheets

(56)     References Cited

U.S. PATENT DOCUMENTS

| | | | |
|---|---|---|---|
| 2012/0314738 A1 | 12/2012 | Kashima et al. | |
| 2014/0036988 A1 | 2/2014 | Kashima et al. | |
| 2016/0036604 A1 | 2/2016 | Mori et al. | |
| 2018/0143732 A1* | 5/2018 | Ochenas | G06F 3/02 |
| 2018/0167216 A1* | 6/2018 | Walrant | H04L 9/0894 |
| 2020/0091898 A1* | 3/2020 | Kubota | H03K 5/19 |
| 2020/0092015 A1* | 3/2020 | Tomita | H04B 15/02 |
| 2021/0357353 A1 | 11/2021 | Suzuki et al. | |
| 2022/0014180 A1* | 1/2022 | Shlomo | G11C 5/148 |
| 2022/0243521 A1* | 8/2022 | Herman | B60R 1/12 |

OTHER PUBLICATIONS

Translation of CN-101051851-A (Year: 2007).*
Translation of CN-101449189-A (Year: 2009).*
PCT International Search Report and Written Opinion, PCT/US2023/034857, Jan. 12, 2024.

* cited by examiner

LOCAL INTERCONNECTED NETWORK BUS REPEATER DELAY COMPENSATION

CROSS REFERENCE TO RELATED APPLICATIONS

This application claims priority under 35 U.S.C. 119(e) to U.S. Provisional Application Ser. No. 63/415,282, entitled "Local Interconnected Network Bus Repeater Delay Compensation," by Artur Langner, et al., filed on Oct. 11, 2022, the contents of both of which are herein incorporated by reference.

FIELD

The present disclosure relates to techniques for repeater-delay compensation in a local interconnected network (LIN) bus.

BACKGROUND

In order to provide improved safety and more-convenient transportation options, many automotive manufacturers are including additional sensors and/or features in their vehicles. For example, self-driving cars typically include a wide variety of sensors, such as acoustic and/or electromagnetic sensors that monitor the surrounding environment to detect other vehicles, people, animals, or obstacles. Moreover, many vehicles include sensors that monitor the operation of the vehicles (such as parking sensors or seat-adjustment sensors) and, more generally, components that provide features or functionality (such as internal lighting).

Electrically connecting these sensors and components in a vehicle to one or more integrated circuits is often challenging. Notably, the sensors and components in existing vehicles are often at disparate locations. Furthermore, the sensors and components in existing vehicles are often electrically connected to the one or more integrated circuits using separate wiring. However, as the number of sensors and components continues to increase, the wiring is becoming increasingly complicated, expensive and cumbersome to install and maintain.

SUMMARY

Embodiments of an integrated circuit are described. This integrated circuit includes: an input pad or connector that couples to a segment of a local interconnected network (LIN) bus; a receive circuit, coupled to the input pad or connector, that receives bits; a measurement circuit, coupled to the receive circuit, that measures: a rising-edge time and a falling-edge time in the bits, or a bit time and a second bit time in the bits; control logic, coupled to the measurement circuit, that compares the rising-edge time and the falling-edge time, or the bit time and the second bit time; a transmit circuit, coupled to the receive circuit, that transmits the bits on an output pad or connector; the output pad or connector, coupled to the transmit circuit, that couples a second segment of the LIN bus; and a delay circuit, coupled to the control logic, that applies, based at least in part on the comparison, a delay to: one or more rising edges or falling edges in the bits; or one or more bit times or second bit times in the bits.

Note that the measurement circuit may perform the measurements based at least in part on a synchronous clock corresponding to the bits.

Moreover, the delay circuit may include a digital counter.

Furthermore, the bit time may correspond to a value of the bits and the second bit time may correspond to a second value of the bits that is less than the value.

Additionally, the delay may be adjustable (e.g., continuous-valued). Alternatively, the delay may have a predefined value or a predefined value in a set of possible predefined values.

In some embodiments, the integrated circuit may include a data repeater.

Note that, when the rising-edge time is larger than the falling-edge time, the delay circuit may delay the one or more falling edges and, when the falling edge time is larger than the rising-edge time, the delay circuit may delay the one or more rising edges. Alternatively or additionally, when the bit time is larger than the second bit time, the delay circuit may decrease the bit time and, when the second bit time is larger than the bit time, the delay circuit may decrease the second bit time.

Moreover, the integrated circuit may include: a second input pad or connector that couples to the second segment of the LIN bus; a second receive circuit, coupled to the second input pad or connector, that receives second bits; a second measurement circuit, coupled to the second receive circuit, that measures: a second rising-edge time and a second falling-edge time in the second bits, or a third bit time and a fourth bit time in the second bits; second control logic, coupled to the second measurement circuit, that compares the second rising-edge time and the second falling-edge time, or the third bit time and the fourth bit time; a second transmit circuit, coupled to the second receive circuit, that transmits the received second bits on a second output pad or connector; the second output pad or connector, coupled to the second transmit circuit, that couples the segment of the LIN bus; and a second delay circuit, coupled to the second control logic, that applies, based at least in part on the comparison, a second delay to: one or more second rising edges or second falling edges in the second bits; or one or more third bit times or fourth bit times in the second bits.

Furthermore, the second control logic may be different from the control logic. Alternatively, the second control logic may be the same as the control logic.

Another embodiment provides an electronic device that includes the integrated circuit.

Another embodiment provides a system that includes the integrated circuit.

Another embodiment provides a method for performing compensation. This method includes at least some of the operations performed by the integrated circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

Figure 1:
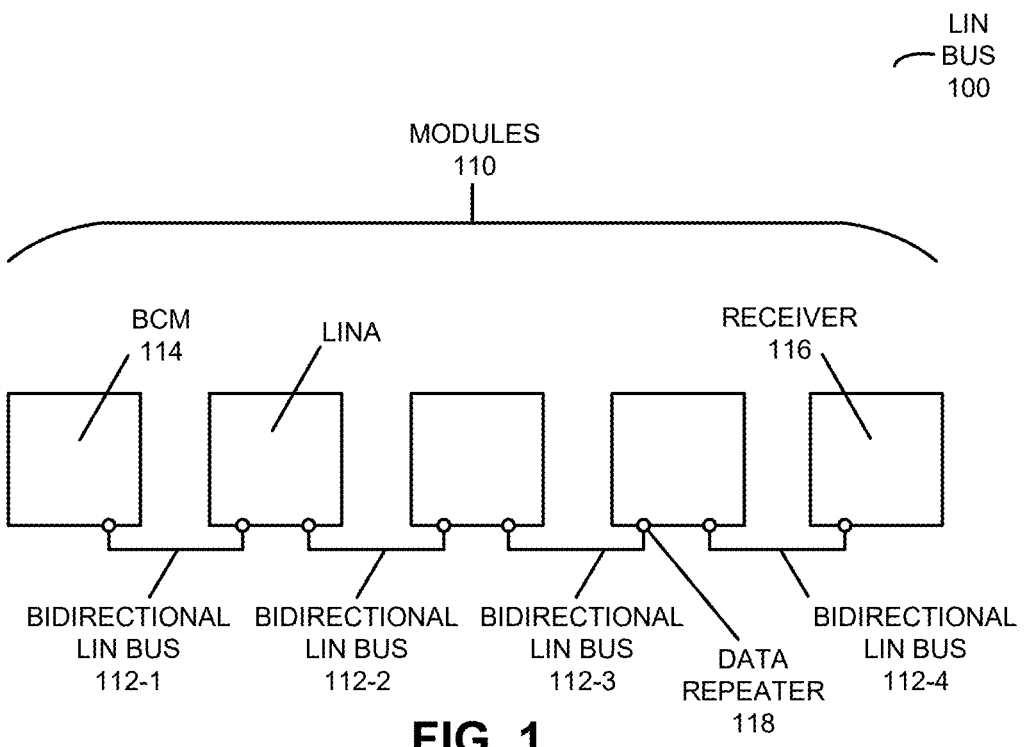
FIG. 1 is a block diagram illustrating an example of a local interconnected network (LIN) bus according to some embodiments of the present disclosure.

An integrated circuit is described. This integrated circuit may include: a receive circuit, coupled to a segment of a LIN bus, that receives bits; a measurement circuit, coupled to the receive circuit, that measures: a rising-edge time and a falling-edge time in the bits, or a bit time and a second bit time in the bits; control logic, coupled to the measurement circuit, that compares the rising-edge time and the falling-edge time, or the bit time and the second bit time; a transmit circuit, coupled to the receive circuit, that transmits the bits on a second segment of the LIN bus; and a delay circuit, coupled to the control logic, that applies, based at least in part on the comparison, a delay to: one or more rising edges or falling edges in the bits; or one or more bit times or second bit times in the bits.

By delaying the one or more rising edges or the falling edges in the bits, or the one or more bit times or second bit times in the bits, these circuit techniques may perform compensation to correct or preserve a duty cycle in the bits. This capability may allow the LIN bus to include different lengths or wiring or, alternatively, a variable number of nodes or modules. Consequently, the circuit techniques may improve the performance of the LIN bus as a function of different lengths or different numbers of nodes or modules. Therefore, the circuit techniques may increase adoption of the LIN bus in a variety of applications, such as automotive applications. Moreover, by improving the performance of the LIN bus, the circuit techniques may improve satisfaction of users of the LIN bus.

We now describe embodiments of the circuit techniques. As noted previously, electrically connecting sensors and components in a vehicle is often challenging. One approach for addressing these problems is for the sensors and components to share common wiring. For example, the sensors and components may be electrically coupled in series using a bus, such as a LIN bus.

Notably, a LIN bus is a type of bus that is often used in automotive applications. A LIN bus typically includes a single-wire for communication in a given direction, which may communicate data frames (which include data bits) using an open-drain, 12V universal asynchronous receiver/transmitter (UART) that operates at a maximum frequency of 20 kHz. Moreover, a LIN bus usually operates using a master-slave protocol with up to eight nodes or modules (including a master and slaves) connected in series, where a given slave on the LIN bus has an associated address. For example, the eight modules may include sensors. Note that some components (e.g., parking sensors) may benefit from automatic-position detection, such as where the associated LIN-bus address depends on the physical position of a given sensor. This capability may allow a single sensor or component (such as a bumper sensor) to be used at different sensor or component positions (such as multiple bumper positions).

For example, in order to detect sensor or component positions, a LIN bus may implement slave node position detection (SNPD), such as by using an SNPD switch technique. In the SNPD switch technique, a LIN bus may have a LIN IN wire and a LIN OUT wire. The LIN IN wire may be electrically coupled to a LIN transmit (TRX) pin on a given module on the LIN bus (such as a master or a slave). Additionally, there may be a bidirectional switch (such as a FET), e.g., on a circuit board or in the given module, that connects LIN OUT to LIN IN under software control. The master on the LIN bus may assign an address to a slave and may instruct the slave to turn on its bidirectional switch to communicate with slaves further downstream on the LIN bus. Note that the bidirectional switch typically has low resistance (below 0.3 R). Consequently, when implemented in an integrated circuit for the given module, the bidirectional switch may consume a large amount of area, which increases the cost. Alternatively, when implemented as an external component on a circuit board that includes the given module, the bidirectional switch may also increase the cost.

FIG. 1 presents a block diagram illustrating an example of a LIN bus 100. Notably, FIG. 1 shows serially daisy-chained modules 110 or nodes along LIN bus 100 that are electrically coupled by a bidirectional LIN bus (such as segments of bidirectional LIN bus 112). Note that adjacent pairs of modules in FIG. 1 are electrically coupled by separate LIN-bus segments that logically operate as a single LIN bus 100.

During operation, a body control module (BCM) 114 in LIN bus 100 may communicate one or more data frames to a receiver 116, such as one of modules 110. Notably, the one or more data frames may be addressed to receiver 116. While all modules 110 may receive the one or more data frames, only the designated (addressed) receiver 116 may act in response to receiving the one or more data frames. Thus, via a master-slave protocol, BCM 114 may trigger communication from receiver 116. Note that two or more of modules 110 may be different types of modules or may be identical instances of the same type of module, such as a type of sensor.

In some embodiments, LIN bus 100 in FIG. 1 may implement SNPD. For example, data repeaters (such as data repeater 118) in each of modules 110 in LIN bus 100 may copy data frames upstream and downstream. Note that before LIN bus 100 has been configured, the data repeaters may be turned off. Therefore, SNPD may be performed as each data repeater is turned on in sequence.

Figure 2:
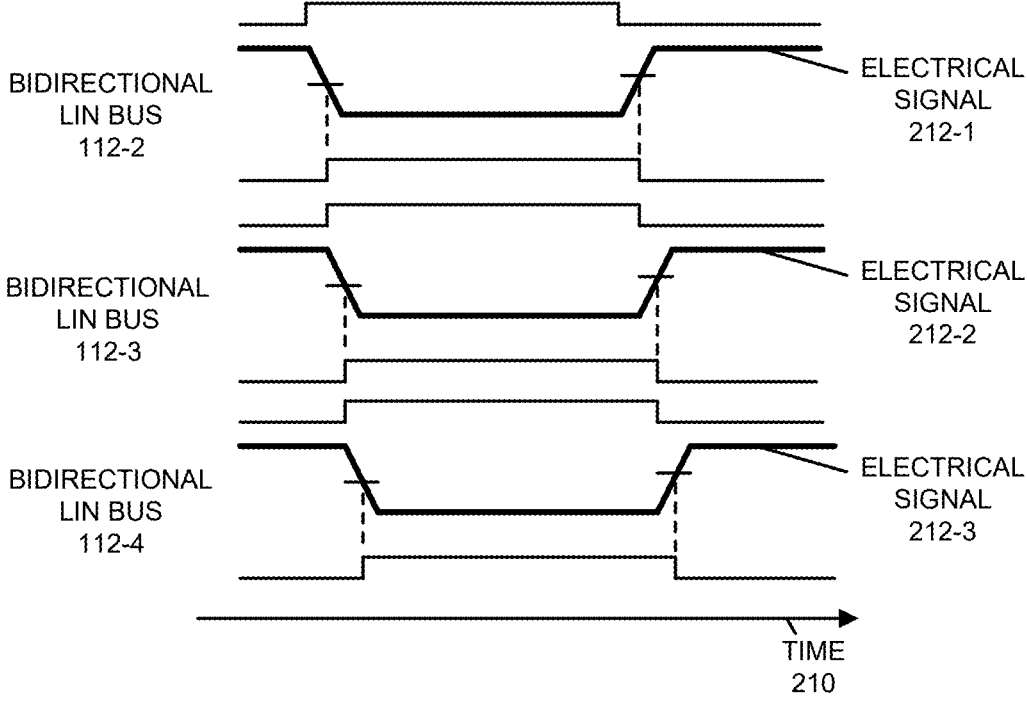
FIG. 2 is a timing drawing illustrating an example of communication using the LIN bus of FIG. 1 according to some embodiments of the present disclosure.

FIG. 2 presents a timing drawing illustrating an example of communication using LIN bus 100 of FIG. 1. Notably, FIG. 2 shows the electrical signals 212 on different segments of directional LIN bus 112 as a function of time 210. In FIG. 2, a data bit may be transmitted from BCM 114, and may be repeated with a small delay to receiver 116.

Referring back to FIG. 1, note that in some embodiments one or more of the modules 110 shown in FIG. 1 (such as the first module to the right of BCM 114, which is sometimes referred to as 'LINA') may not be part of a local LIN bus between components or sensors (such as in a bumper). For example, the link between BCM 114 and LINA may be part of the communication link between BCM 114 and a bumper.

Figure 3:
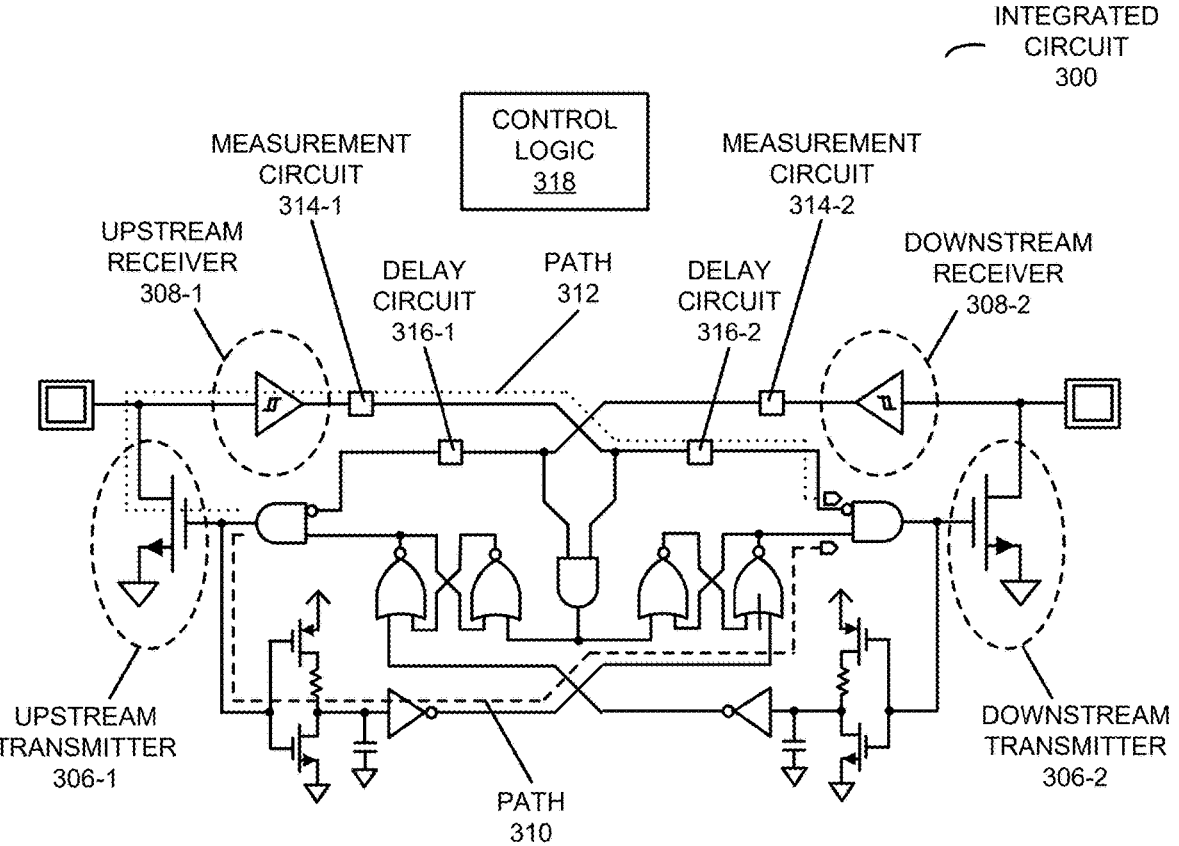
FIG. 3 is a block diagram illustrating an example of an integrated circuit that includes a data repeater in the LIN bus of FIG. 1 according to some embodiments of the present disclosure.

In some embodiments, a data repeater may be used to implement the SNPD-switch technique. This is shown in FIG. 3, which presents a block diagram of an integrated circuit 300 at a module or node in LIN bus 100 (FIG. 1) that includes a data repeater. Notably, integrated 300 circuit that includes the data repeater may have two LIN transmitters (TRX) 306 (which each may occupy less area than a low resistance switch), which may be implemented using FETs. The data repeater in integrated circuit 300 may be implemented using a small digital logic circuit. This approach may allow the data bit communicated on LIN bus 100 (FIG. 1) to be regenerated, so it can be communicated over longer wiring lengths in LIN bus 100 (FIG. 1). For example, if integrated circuit 300 is node position 1 in LIN bus 100 (FIG. 1) and the master communicates a data bit in a data frame to node position 1, upstream receiver 308-1 in integrated circuit 300 (such as a Schmidt trigger) may receive the data bit and downstream transmitter 306-1 may repeat the data bit to node position 2.

Note that in the preceding discussion the implementation shown in FIG. 3 does not include any compensation. Consequently, as described, this implementation may only work under ideal conditions. For example, the length of the wiring (and, thus, the capacitance) in LIN bus 100 (FIG. 1) can vary between nodes or modules 110 (FIG. 1). Because path 310 in integrated circuit 300 may need to be faster than path 312, a delay may need to be added to path 312. Moreover, as described further below, integrated circuit 300 may optionally include measurement circuits 314 (such as digital counters), delay circuits 316 and/or control logic 318 to perform compensation of rising and/or falling edges in repeated data bits in order to preserve a duty cycle.

Figure 4:
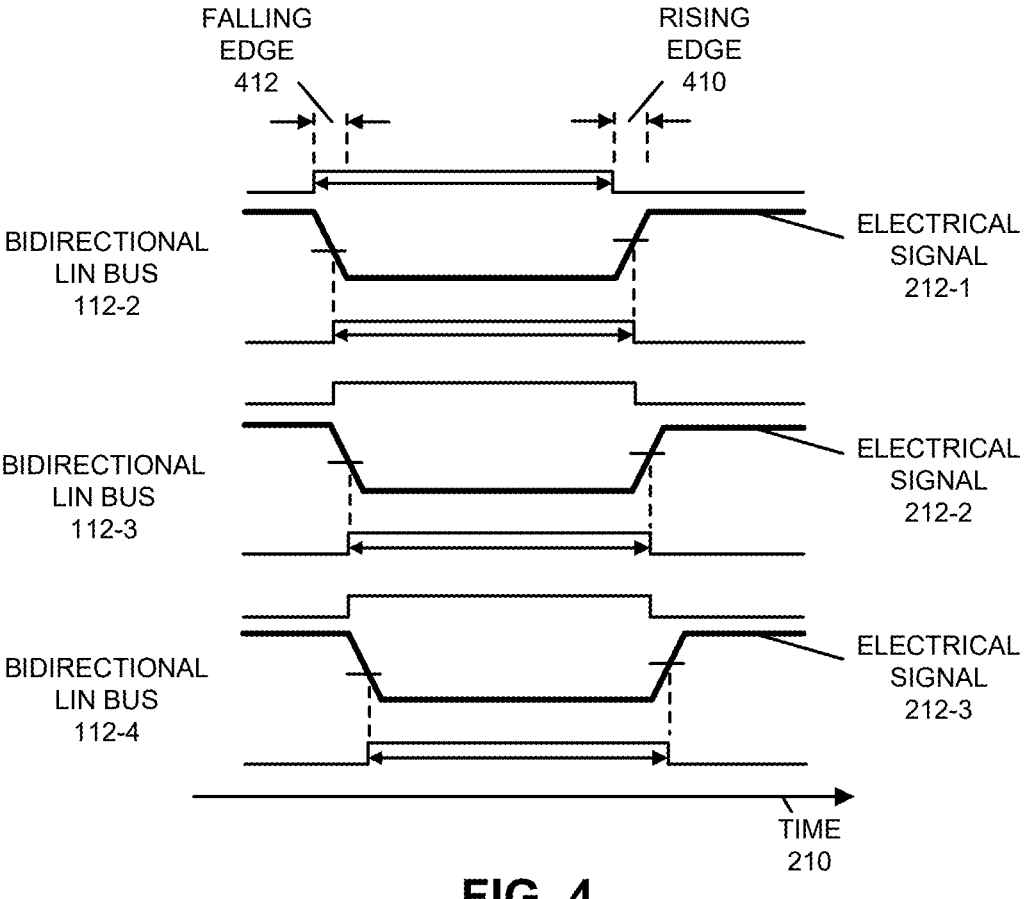
FIG. 4 is a timing drawing illustrating an example of communication using the LIN bus of FIG. 1 according to some embodiments of the present disclosure.

While a LIN bus can reduce the number of wires in a vehicle (and, thus, the associated complexity, expense and installation and maintenance difficulties), it can result in additional challenges, e.g., as the number of modules 110 (FIG. 1) on LIN bus 100 (FIG. 1) increases, it may be increasingly difficult for modules 110 (FIG. 1) to receive the data frames because of propagation delays. This is shown in FIG. 4, which presents a timing diagram illustrating an example of communication using LIN bus 100 (FIG. 1). Notably, FIG. 4 shows the timing for the case where a rising edge 410 is the same as a falling edge 412 for four nodes or modules 110 in the daisy-chain (e.g., LINB, LINC, LIND). In this case, the width of the received data bit (RXD) is the same at node position 2, 3, 4:

$$t_{RXD2} = t_{RXD3} = t_{RXD4} = t_{TXD1}.$$

Consequently, a data bit transmitted from node position 1 arrives with the same pulse width at node position 4 (plus a small delay). More generally, the length of '1' and '0' data bits usually needs to be conserved over LIN bus 100 (FIG. 1).

Note that LIN bus 100 (FIG. 1) is typically driven low' by an active pulldown, but is usually driven 'high' by passive resistive pullup. Consequently, when driving a 50% square-wave signal, the high and low periods (as seen by a logic input) may have a different duty cycle. However, the maximum and minimum duty cycle is limited and specified in the LIN bus standard (from CAN in Automation (CiA) 391, of Nuremburg, Germany). Notably, a passive device (such as a switch) usually does not change the duty cycle very much, while an active repeater (that has a logic input) often has different propagation delays for rising and falling edges. This asymmetry can result in increasingly different lengths of high and low bits times down LIN bus 100 (FIG. 1) as more nodes or modules 110 (FIG. 1) are added. This dispersion is typically not predictable (e.g., it depends on the capacitance of LIN bus 100 in FIG. 1). When the dispersion is not compensated, then the communication on LIN bus 100 (FIG. 1) may become unreliable.

In order to address this problem, the disclosed circuit techniques may be used to preserve the duty cycle for high and low bit times during communication on LIN bus 100 (FIG. 1). Notably, a downstream receiver (such as down-stream receiver 308-2 in FIG. 3) may be used to sense how LIN bus 100 (FIG. 1) is behaving and the low or high period may be extended in order to preserve the duty cycle for high and low bits.

Figure 5:
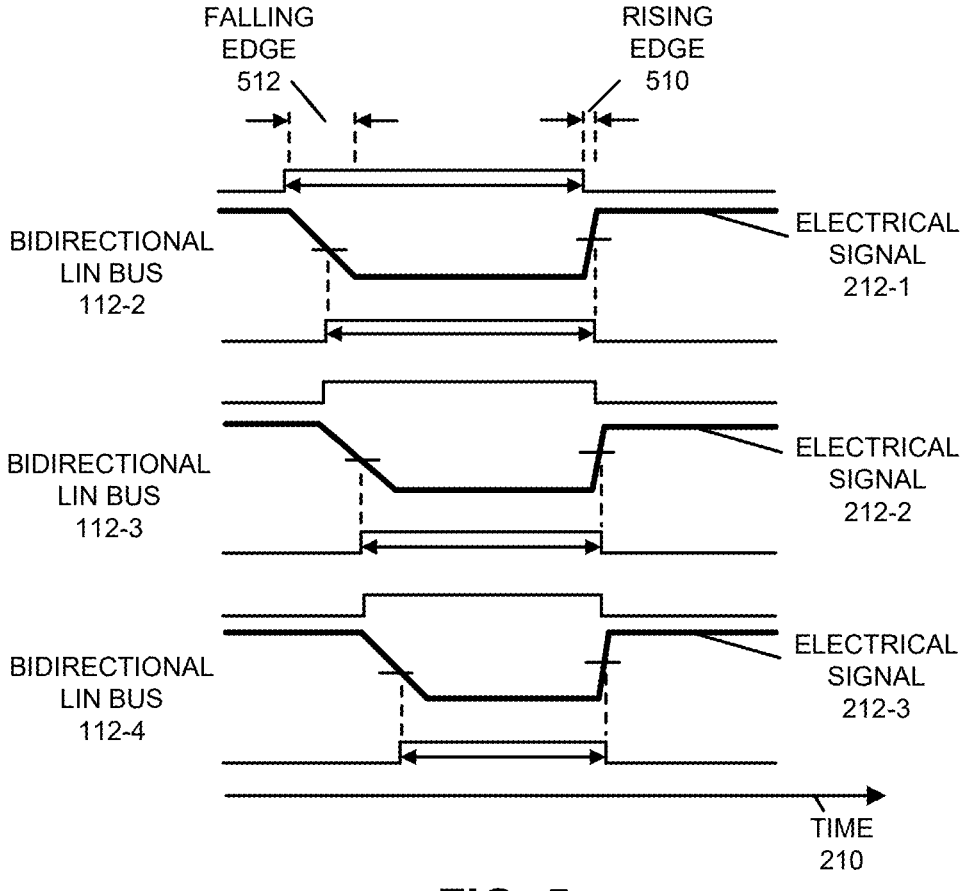
FIG. 5 is a timing drawing illustrating an example of communication using the LIN bus of FIG. 1 according to some embodiments of the present disclosure.

The effect of unbalanced rising and falling edge times or delays is shown in FIG. 5, which presents a timing diagram illustrating an example of communication using LIN bus 100 (FIG. 1). Notably, FIG. 5 shows the timing for the case where a rising edge 510 is faster than a falling edge 512, for all nodes or modules 110 (FIG. 1) on the daisy-chain (e.g., LINB, LINC, LIND). This situation may occur when the capacitance on LIN bus 100 (FIG. 1) is low, such as when LIN bus 100 (FIG. 1) only has two nodes and, thus, has short wiring lengths. In this case, the width of the received data bit may decrease along the daisy-chain:

$$t_{TXD1} > t_{RXD2} > t_{RXD3} > t_{RXD4}.$$

Consequently, a data bit transmitted from node position 1 may arrive with a reduced pulse width at node position 4 (plus a delay).

Within a few nodes (three in the worst case), the pulse-width deviation may exceed that allowed by a LIN bit-width specification. Even when the pulse width does not need to meet a LIN specification, the universal asynchronous receiver/transmitter (UART) may fail after only a few more nodes or modules (and, thus, less than the eight nodes or modules that may be used in many applications).

Figure 6:
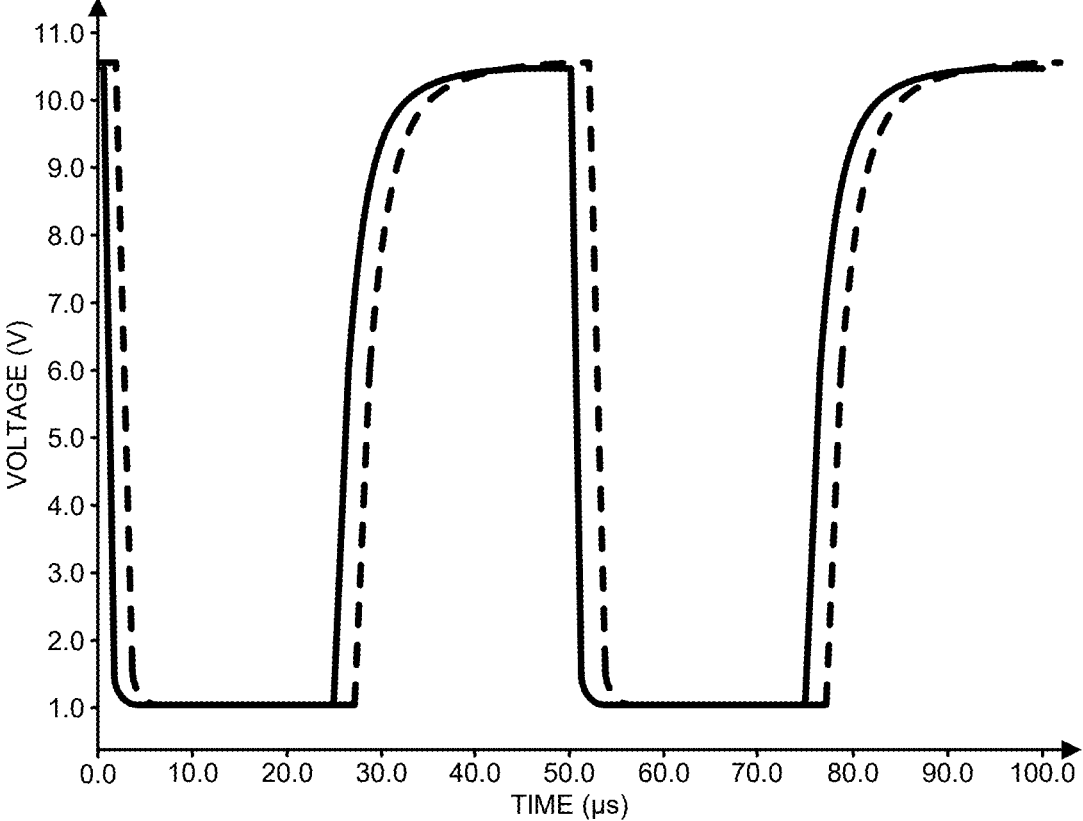
FIG. 6 is a drawing illustrating an example of simulated propagation delays along the LIN bus of FIG. 1 according to some embodiments of the present disclosure.

FIG. 6 presents a drawing illustrating an example of simulated propagation delays along LIN bus 100 (FIG. 1) in the presence of unbalanced rising and falling edge times or delays.

Ideally, a 50% square-wave signal would have the same duty cycle when sent by the data repeater. Nonetheless, the propagation delay of either a rising or falling edge can be longer (depending on the capacitance of the LIN bus). When a data repeater has a fast enough reference clock (such as 16 MHz vs. the 20 kHz LIN-bus clock frequency), this delay may be measured using the downstream LIN transmitter (such as downstream transmitter 306-2 in FIG. 3). Then, when the rising edge propagation delay is the longer one, the falling edge may be delayed using a delay circuit (such as using synchronous logic, e.g., using a digital counter). Alternatively, when the falling edge propagation delay is the longer one, the rising edge may be delayed using the delay circuit (such as using synchronous logic, e.g., using the digital counter). Thus, in the circuit techniques, compensation may be applied to preserve the duty cycle. Notably, after compensation, the duty cycle of high and low bit times may be the same or approximately the same (such as within 1, 5, 10 or 20% of each other).

For example, when a data bit is received upstream and repeated downstream, a measurement of a falling-edge time or delay associated with a '1' to a '0' transition may be performed (such as using measurement circuit 314-1), e.g., using a fast synchronous clock (such as 16 MHz). Moreover, when a second data bit is received upstream and repeated downstream, a measurement of a rising-edge time or delay associated with a '0' to a '1' transition may be performed, e.g., using the fast synchronous clock. Then, the duration of a high bit time (such as a bit time associated with a '1') and the duration a low bit time (such as a bit time associated with a '0') may be compared. Alternatively, the falling-edge time or delay and the rising-edge time or delay may be compared. Based at least in part on the comparison, a correction may be applied (e.g., using delay circuit 316-2) to the current and/or subsequent falling or rising edges so that the duration of a high bit time is at least approximately the same as the duration of a low bit time. Notably, in some embodiments, the compensation may include: when the rising-edge time or delay is larger than the falling-edge time or delay, the falling edge may be delayed using a delay circuit; and when the falling edge time or delay is larger than the rising-edge time or delay, the rising edge may be delayed using the delay circuit. By applying this correction to every rising edge or falling edge, the circuit techniques may provide compensation for temperature variation. Note that the compensation may be applied at a transmitter (unidirectionally) or at two transmitters (bidirectionally).

In some embodiments, a digital counter may be used to perform the measurements.

Moreover, as described previously, in some embodiments the comparison is on a relative basis, such as of two measurements (the rising-edge time or delay and the falling-edge time or delay, or the high bit time and the low bit time). However, in other embodiments, the comparison may be relative to a reference or target value, such as: a predefined rising-edge time or delay, a predefined falling-edge time or delay, a predefined high bit time, and/or a predefined low bit time.

Figure 7:
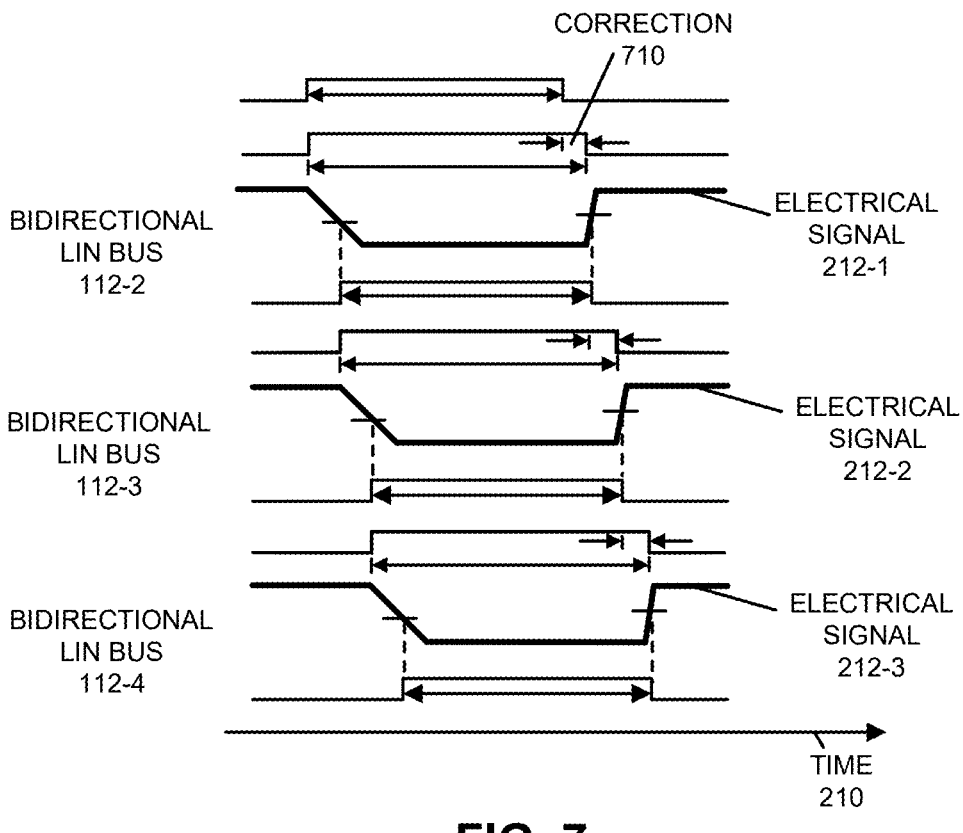
FIG. 7 is a timing drawing illustrating an example of communication using the LIN bus of FIG. 1 according to some embodiments of the present disclosure.

FIG. 7 presents a timing drawing illustrating an example of communication using LIN bus 100 (FIG. 1). Notably, as discussed previously, the asymmetry in the rising/falling-edge times or delays may be compensated by adjusting the width of the transmit data (the inverse of this signal may control the LIN pull-down driver). For example, at node position 1, $t_{TXDC1}$ may be the symmetric bit width generated by the LIN controller (such as control logic 318). In order to compensate for a slow falling edge, a delay $t_{TXDDEL1}$ may be added to the high time of $t_{TXDC1}$ to extend the high time of $t_{TXD1}$. Therefore, the width of the received data bit at node position 2 may be 'corrected', such that it has the intended width, $t_{RXD2}=t_{TXDC1}$. The net effect may be a correction (such as correction 710) so that the width of the transmit data is unaffected by the falling-edge and rising-edge slopes. Note that adjustable delays may be added at each node position to allow the daisy-chain length of LIN bus 100 (FIG. 1) to be extended to any number of nodes or modules.

We now discuss measuring the rising-edge and the falling-edge times or delays. Notably, the delay applied at node position 1 may need to compensate for the delays on LINB as they are received at node position 2. At node position 1, this may be accomplished by having an identical receiver to the receiver at node position 2. Moreover, if we assume that the signal seen on LINB at node position 1 and node position 2 is identical or approximately identical (e.g., within 1, 5, 10 or 20% of each other), then we can use the receiver at node position 1 as a proxy for the receiver at node position 2. Note that there are errors that may make the identical assumption incorrect, such as a voltage drop on the voltage from the battery (VBAT) along LIN bus 100 (FIG. 1). However, in general, these errors will be small. Thus, in the circuit techniques, we can use the delay between the transmit (TXD) and receive (RXD) signals at any transmitting pin (e.g., in integrated circuit 300 in FIG. 3) to calculate the delay that should be applied to the transmit signal.

Note that the measured rising-edge or falling-edge times or delays may be measured at each transmitter (such as upstream transmitter 306-1 or downstream transmitter 306-2 in FIG. 3). The determined delay may be applied to the data bits whenever this transmitter is transmitting data, such as when the data bits are from the controller in the same node or module as the transmitter, or when the transmitter is acting as a data repeater.

While the preceding discussion illustrated the use of the circuit techniques with a LIN bus (such as LIN bus 100 in FIG. 1), in other embodiments the circuit techniques may be used with other types of electrical or optical buses, such as a USB bus.

Figure 8:
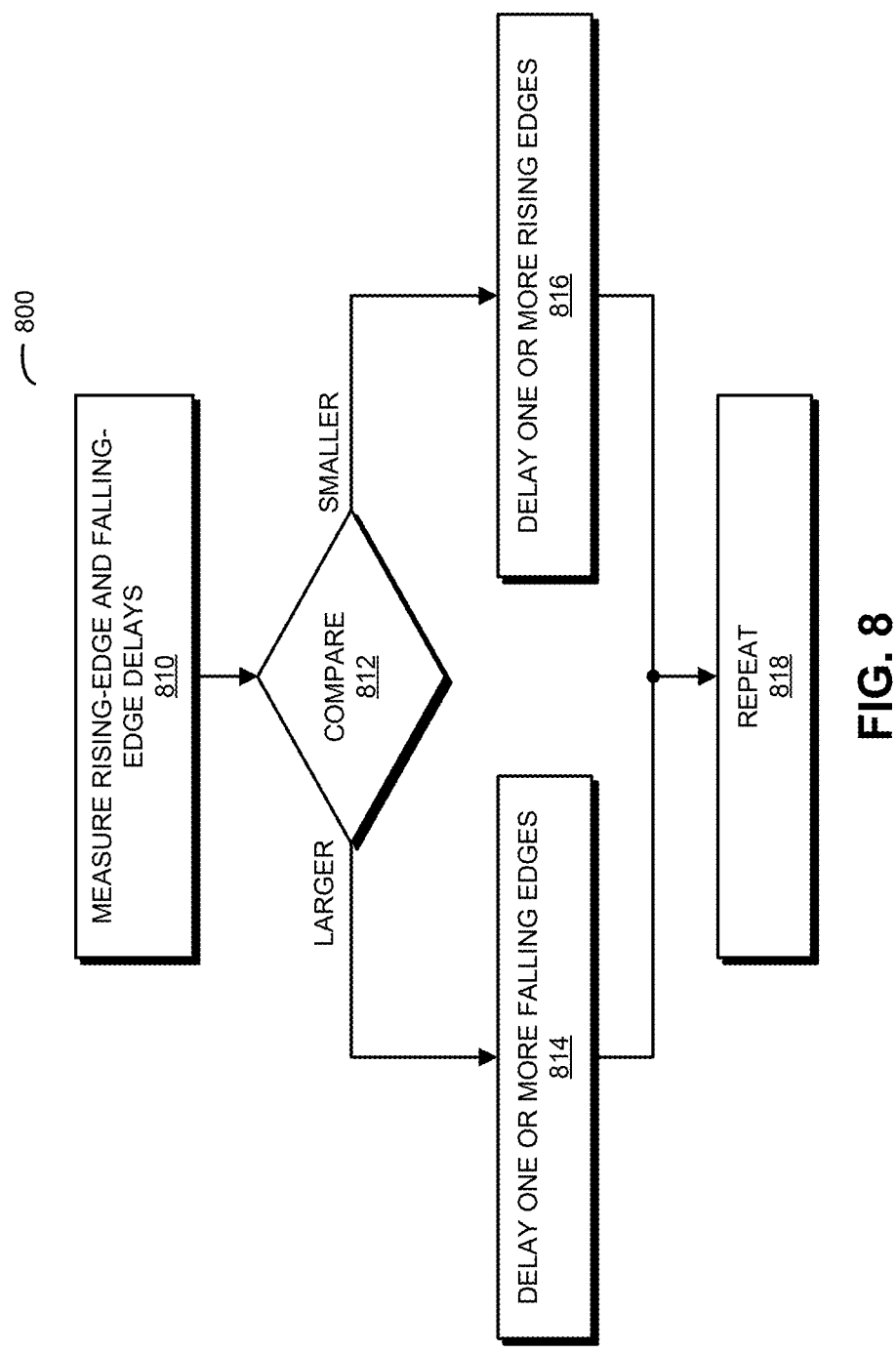
FIG. 8 is a flow diagram illustrating an example of a method for performing compensation according to some embodiments of the present disclosure.

We now describe embodiments of a method. FIG. 8 presents a flow diagram illustrating an example of a method 800 for performing compensation using an integrated circuit, such as integrated circuit 300 (FIG. 3). During operation, the integrated circuit may perform measurements of a rising-edge time or delay and a falling-edge time or delay (operation 810) for bits, e.g., data bits in a data fame. Then, the integrated circuit may compare (operation 812) the rising-edge time or delay and the falling-edge time or delay. When the rising-edge time or delay is larger than the falling-edge time or delay (operation 812), the integrated circuit may delay the current and/or one or more subsequent falling edges (operation 814) in the bits. Alternatively, when the rising-edge time or delay is less than the falling-edge time or delay (operation 812), the integrated circuit may delay the current and/or one or more subsequent rising edges (operation 816) in the bits. Next, the integrated circuit may optionally repeat (operation 818) at least some of the operations in method 800.

In some embodiments of the method 800, there may be additional or fewer operations. Moreover, the order of the operations may be changed, and/or two or more operations may be combined into a single operation.

The disclosed integrated circuit and the circuit techniques can be (or can be included in) any electronic device or system. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the integrated circuit and/or the integrated circuit that includes the integrated circuit, in alternative embodiments different components and/or subsystems may be present in the integrated circuit and/or the integrated circuit that includes the integrated circuit. Thus, the embodiments of the integrated circuit and/or the integrated circuit that includes the integrated circuit may include fewer components, additional components, different components, two or more components may be combined into a single component, a single component may be separated into two or more components, one or more positions of one or more components may be changed, and/or there may be different types of components.

Moreover, the circuits and components in the embodiments of the integrated circuit and/or the integrated circuit that includes the integrated circuit may be implemented using any combination of analog and/or digital circuitry, including: bipolar, PMOS and/or NMOS gates or transistors. Furthermore, signals in these embodiments may include digital signals that have approximately discrete values and/ or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
an input pad or connector configured to couple to a first segment of a local interconnected network (LIN) bus;
a receive circuit, coupled to the input pad or connector, configured to receive bits;
a measurement circuit, coupled to the receive circuit, configured to measure: a rising-edge time and a falling-edge time in the bits, or a first bit time and a second bit time in the bits;
first control logic, coupled to the measurement circuit, configured to compare the rising-edge time and the falling-edge time, or the first bit time and the second bit time;
a transmit circuit, coupled to the receive circuit, configured to transmit the bits on an output pad or connector;
the output pad or connector, coupled to the transmit circuit, configured to couple to a second segment of the LIN bus; and
a delay circuit, coupled to the first control logic, configured to apply, based at least in part on the comparison, a delay to: one or more rising edges or falling edges in the bits; or one or more first bit times or second bit times in the bits, wherein the delay compensates for different lengths or wiring in the LIN bus or a variable number of nodes or modules in the LIN bus, and maintains a duty cycle of the bits, and
wherein the LIN bus is associated with a vehicle and the integrated circuit is configured to perform automatic position detection in the vehicle from a set of component positions on the LIN bus.

2. The integrated circuit of claim 1, wherein the measurement circuit is configured to perform the measurements based at least in part on a synchronous clock corresponding to the bits.

3. The integrated circuit of claim 1, wherein the delay circuit comprises a digital counter.

4. The integrated circuit of claim 1, wherein the first bit time corresponds to a first value of the bits and the second bit time corresponds to a second value of the bits that is less than the first value.

5. The integrated circuit of claim 1, wherein the delay is adjustable.

6. The integrated circuit of claim 1, wherein the integrated circuit comprises a data repeater.

7. The integrated circuit of claim 1, wherein, when the rising-edge time is larger than the falling-edge time, the delay circuit is configured to delay the one or more falling edges; and
wherein, when the falling edge time is larger than the rising-edge time, the delay circuit is configured to delay the one or more rising edges.

8. The integrated circuit of claim 1, wherein, when the first bit time is larger than the second bit time, the delay circuit is configured to decrease the first bit time; and

wherein, when the second bit time is larger than the first bit time, the delay circuit is configured to decrease the second bit time.

9. The integrated circuit of claim 1, wherein the integrated circuit comprises:
  a second input pad or connector configured to couple to the second segment of the LIN bus;
  a second receive circuit, coupled to the second input pad or connector, configured to receive second bits;
  a second measurement circuit, coupled to the second receive circuit, configured to measure: a second rising-edge time and a second falling-edge time in the second bits, or a third bit time and a fourth bit time in the second bits;
  second control logic, coupled to the second measurement circuit, configured to compare the second rising-edge time and the second falling-edge time, or the third bit time and the fourth bit time;
  a second transmit circuit, coupled to the second receive circuit, configured to transmit the second bits on a second output pad or connector;
  the second output pad or connector, coupled to the second transmit circuit, configured to couple to the first segment of the LIN bus; and
  a second delay circuit, coupled to the second control logic, configured to apply, based at least in part on the comparison, a second delay to: one or more second rising edges or second falling edges in the second bits; or one or more third bit times or fourth bit times in the second bits.

10. The integrated circuit of claim 9, wherein the second control logic is different from the first control logic.

11. An electronic device, comprising:
  an integrated circuit, wherein the integrated circuit comprises:
  an input pad or connector configured to couple to a first segment of a local interconnected network (LIN) bus;
  a receive circuit, coupled to the input pad or connector, configured to receive bits;
  a measurement circuit, coupled to the receive circuit, configured to measure: a rising-edge time and a falling-edge time in the bits, or a first bit time and a second bit time in the bits;
  first control logic, coupled to the measurement circuit, configured to compare the rising-edge time and the falling-edge time, or the first bit time and the second bit time;
  a transmit circuit, coupled to the receive circuit, configured to transmit the bits on an output pad or connector;
  the output pad or connector, coupled to the transmit circuit, configured to couple to a second segment of the LIN bus; and
  a delay circuit, coupled to the first control logic, configured to apply, based at least in part on the comparison, a delay to: one or more rising edges or falling edges in the bits; or one or more first bit times or second bit times in the bits, wherein the delay compensates for different lengths or wiring in the LIN bus or a variable number of nodes or modules in the LIN bus, and maintains a duty cycle of the bits, and
  wherein the LIN bus is associated with a vehicle and the integrated circuit is configured to perform automatic position detection in the vehicle from a set of component positions on the LIN bus.

12. The electronic device of claim 11, wherein the measurement circuit is configured to perform the measurements based at least in part on a synchronous clock corresponding to the bits.

13. The electronic device of claim 11, wherein the delay circuit comprises a digital counter.

14. The electronic device of claim 11, wherein the first bit time corresponds to a first value of the bits and the second bit time corresponds to a second value of the bits that is less than the first value.

15. The electronic device of claim 11, wherein the delay is adjustable.

16. The electronic device of claim 11, wherein, when the rising-edge time is larger than the falling-edge time, the delay circuit is configured to delay the one or more falling edges; and
  wherein, when the falling edge time is larger than the rising-edge time, the delay circuit is configured to delay the one or more rising edges.

17. The electronic device of claim 11, wherein the electronic device comprises a vehicle.

18. A method for performing compensation, comprising by an integrated circuit:
  receiving, on an input pad or connector, bits associated with a first segment of a local interconnected network (LIN) bus;
  measuring: a rising-edge time and a falling-edge time in the bits, or a first bit time and a second bit time in the bits;
  comparing the rising-edge time and the falling-edge time, or the first bit time and the second bit time;
  selectively applying, based at least in part on the comparison, a delay to: one or more rising edges or falling edges in the bits; or one or more first bit times or second bit times in the bits, wherein the delay compensates for different lengths or wiring in the LIN bus or a variable number of nodes or modules in the LIN bus, and maintains a duty cycle of the bits; and
  transmitting, on an output pad or connector, the bits to a second segment of the LIN bus, and
  wherein the LIN bus is associated with a vehicle and the method further comprises performing automatic position detection in the vehicle from a set of component positions on the LIN bus.

19. The method of claim 18, wherein the first bit time corresponds to a first value of the bits and the second bit time corresponds to a second value of the bits that is less than the value.

20. The method of claim 18, wherein the delay is adjustable.

* * * * *